(12) United States Patent
Ettl

(10) Patent No.: US 11,626,244 B2
(45) Date of Patent: Apr. 11, 2023

(54) ASSEMBLY FOR CONNECTING TO A HIGH-VOLTAGE GRID

(71) Applicant: Siemens Energy Global GmbH & Co. KG, Munich (DE)

(72) Inventor: Christian Ettl, Weiz (AT)

(73) Assignee: Siemens Energy Global GmbH & Co. KG, Munich (DE)

( * ) Notice: Subject to any disclaimer, the term of this patent is extended or adjusted under 35 U.S.C. 154(b) by 482 days.

(21) Appl. No.: 16/652,465

(22) PCT Filed: Sep. 12, 2018

(86) PCT No.: PCT/EP2018/074532
§ 371 (c)(1),
(2) Date: Mar. 31, 2020

(87) PCT Pub. No.: WO2019/068438
PCT Pub. Date: Apr. 11, 2019

(65) Prior Publication Data
US 2020/0234875 A1 Jul. 23, 2020

(30) Foreign Application Priority Data
Oct. 6, 2017 (DE) ...................... 10 2017 217 783.7

(51) Int. Cl.
*H01F 30/10* (2006.01)
*G01R 1/36* (2006.01)
(Continued)

(52) U.S. Cl.
CPC .............. *H01F 30/10* (2013.01); *G01R 1/36* (2013.01); *G01R 15/18* (2013.01); *H01F 27/004* (2013.01);
(Continued)

(58) Field of Classification Search
CPC ....................................................... H01F 30/10
See application file for complete search history.

(56) References Cited

U.S. PATENT DOCUMENTS

| 2011/0298287 A1* | 12/2011 | Cobb | H01F 27/002 307/64 |
| 2016/0007490 A1* | 1/2016 | De La Cruz | H01F 27/04 174/535 |

(Continued)

FOREIGN PATENT DOCUMENTS

| DE | 102009043596 A1 | 3/2011 |
| DE | 102010062605 A1 | 6/2012 |

(Continued)

*Primary Examiner* — Jared Fureman
*Assistant Examiner* — Christopher J Clark
(74) *Attorney, Agent, or Firm* — Laurence A. Greenberg; Werner H. Stemer; Ralph E. Locher

(57) ABSTRACT

An assembly for connecting to a high-voltage grid includes a plurality of single-phase transformers, each of which has a transformer tank that is filled with a fluid and is equipped with a core with at least one coil. The coils of the single-phase transformers are at least partly connected together, thereby forming a neutral or star point. In order to permit the assembly to be quickly assembled in situ while at the same time providing a reliable current path for compensation and grounding currents, the coils are connected together by a neutral or star point conductor or rail in order to form the neutral or star point. The neutral or star point conductor or rail is retained in an insulated manner on the transformer tank.

7 Claims, 2 Drawing Sheets

(51) Int. Cl.
  *G01R 15/18* (2006.01)
  *H01F 27/00* (2006.01)
  *H01F 27/29* (2006.01)
  *H01F 27/30* (2006.01)
  *H01F 38/22* (2006.01)

(52) U.S. Cl.
  CPC .............. *H01F 27/29* (2013.01); *H01F 27/30* (2013.01); *H01F 38/22* (2013.01)

(56) References Cited

U.S. PATENT DOCUMENTS

2016/0154051 A1* 6/2016 Watson .............. G01R 31/1272
  324/552
2021/0080514 A1* 3/2021 Beaudet ............. G01R 19/2513

FOREIGN PATENT DOCUMENTS

| DE | 102016216949 A1 | 3/2018 |
| GB | 2464192 A | 4/2010 |
| JP | H04223310 A | 8/1992 |

* cited by examiner

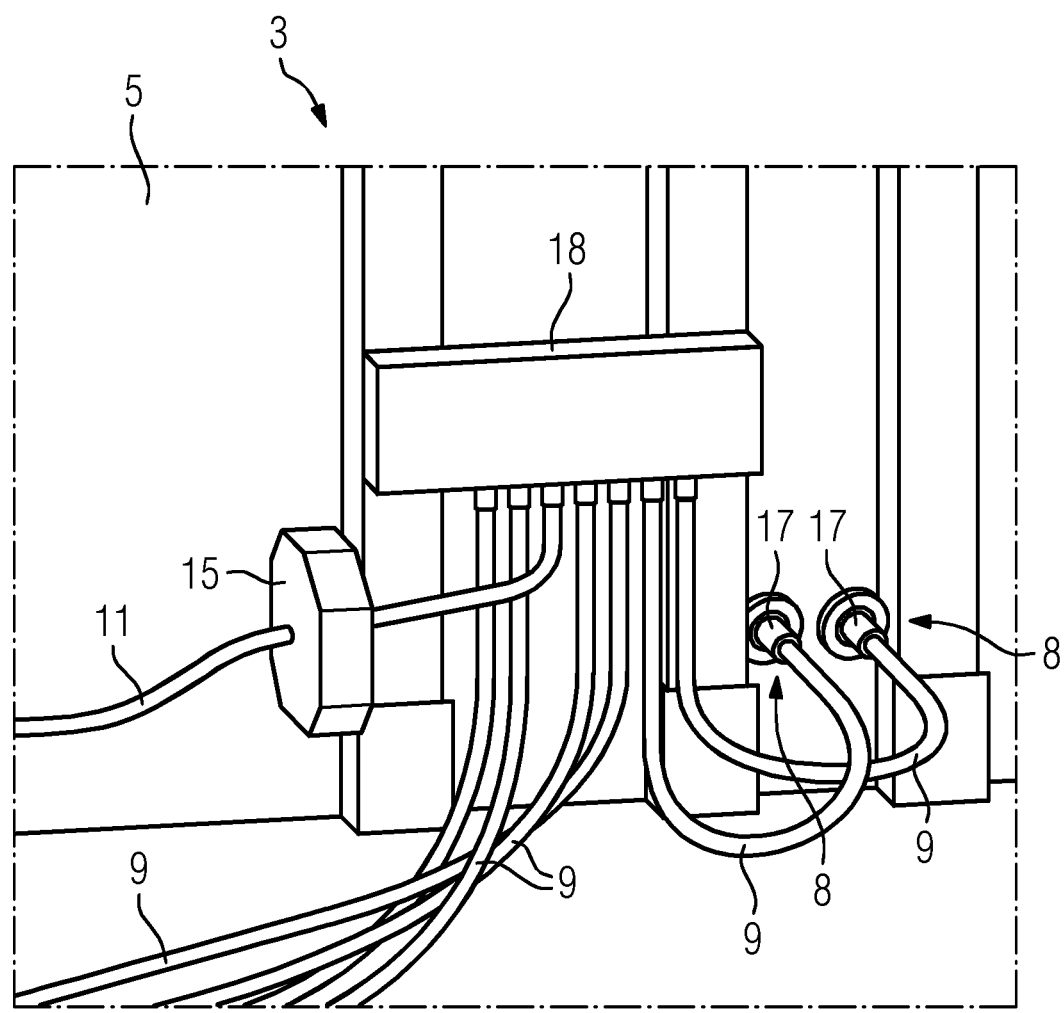

ASSEMBLY FOR CONNECTING TO A HIGH-VOLTAGE GRID

BACKGROUND OF THE INVENTION

Field of the Invention

The invention relates to an assembly for connecting to a high-voltage grid, having a plurality of single-phase transformers, each of which comprises a fluid-filled transformer tank, in which a core having at least one winding is arranged, wherein said windings of the single-phase transformers are at least partly interconnected to constitute a neutral point.

An assembly of this type will be known to a person skilled in the art from established practice. Single-phase transformers are employed, for example, in high-voltage direct current transmission, wherein a single-phase transformer is provided for each phase of the AC voltage grid. Each single-phase transformer is equipped with a transformer tank, in which an active part comprised of a core and a winding is arranged. An insulating fluid, with which the transformer tank is filled, is employed for the cooling and electrical insulation of the active part. The windings of the single-phase transformers are electrically interconnected wherein, in some applications, a neutral point is constituted. In general, a neutral point is formed by means of a ground connection of the corresponding windings.

The known assembly is subject to a disadvantage, in that it is necessary for compensating currents which are routed via the neutral point to flow through a permanently installed rail system of the respective converter substation. However, diversion of the neutral point current via a grounding system of this type entails an operational risk, as said system, in general, is not at all rated for potentially high compensating currents.

SUMMARY OF THE INVENTION

The object of the invention is the provision of an assembly of the above-mentioned type which can be rapidly installed in situ and wherein, at the same time, a more reliable current path for compensating currents and grounding currents is provided.

The invention fulfills this object, wherein the windings are interconnected by means of a neutral point conductor to constitute the neutral point, and wherein the neutral point conductor is retained on a transformer tank in an insulated arrangement.

According to the invention, a neutral point conductor is provided which is directly fastened to the transformer tank. In the context of the invention, a component which is independent of the respective transformers is thus rendered superfluous. Moreover, the flow of compensating currents between the phases of a rail system of the transformer substation is eliminated. According to the invention, the neutral point conductor is retained on the transformer tank in an insulated arrangement. By means of this insulated retention, it is possible for the transformer tank to assume a ground potential, even during the operation of the assembly, wherein the neutral point conductor can assume a floating potential, or is separately grounded.

The invention is particularly advantageous if the assembly according to the invention is provided as a temporary replacement for a defective transformer. If the defective transformer is a three-phase transformer, a rail system in the transformer substation for the conduction of compensating currents is entirely absent, and the complex installation thereof would therefore be required. If three single-phase transformers are to be replaced by the assembly according to the invention, the connection of windings to an existing rail system is complex, as the site of installation of the "new" single-phase transformers, prior to the removal of the transformers to be replaced, is dependent upon the respective availability of space in situ. Moreover, the design of the existing rail system is not adapted to potential compensating currents occurring further to said replacement.

In the context of the invention, the neutral point conductor can, in principle, be configured as required. According to the invention, the neutral point conductor is comprised of a material having a high electrical conductivity, preferably of a metal or a metallic compound. In one variant, the neutral point conductor is comprised of copper.

Each neutral point conductor is appropriately configured as a busbar, which is fastened to the transformer tank by means of insulators. The insulators are advantageously rated for voltages in the region of 5 to 20 kV, in particular 10 kV, such that it is now possible, in the context of the invention, for the neutral point conductor to assume an electrical potential which differs from the potential of the transformer tank. A busbar is a solid mechanical component which, conversely to conductor wires or cables, is rigid, i.e. not flexible. A solid busbar provides the necessary mechanical retention for the requisite connections with the respective winding ends.

According to a preferred configuration of the invention, a busbar is provided for each transformer tank. According to this further development of the invention, the manufacturing process of the single-phase transformers can be configured in an entirely identical manner. Each transformer tank comprises an identical neutral point conductor which, for example, is fastened to the respective transformer tank by means of insulators, supports or other electrically non-conductive retaining means. Costs are reduced as a result. For the constitution of the neutral point of the windings, one of the neutral point conductors is connected to all the windings whereas, in the respective application, the other neutral point conductors remain unused. In this manner, the most appropriate neutral point conductor for the respective application can be selected. This simplifies and accelerates the installation of the assembly in situ. The assembly according to the invention can thus be deployed in a flexible manner.

According to a preferred variant of the invention, each transformer tank comprises at least one neutral point socket, having a neutral point contact which is retained on the transformer tank in an insulated arrangement, wherein the neutral point contact is connected to at least one of the windings and, by means of a cable connection, is connected to the neutral point conductor. According to this variant of the invention, the windings are interconnected by means of a pluggable cable connection. The neutral point can thus be rapidly constituted in situ. Firstly, the single-phase transformers are positioned in a distributed arrangement on-site, in accordance with the available space. Thereafter, the respective neutral point cables, at their pluggable cable terminations, are inserted into the neutral point socket. For example, the neutral point cable, at the end thereof which is averted from the cable termination, comprises a simple cable shoe, by means of which it can be fastened to the rigid neutral point conductor in a secure and reliable manner, for example by means of a simple screw connection.

The cable connector or—in other words—the cable termination at one end of the neutral point cable is generally configured with a complementary or matching shape to the neutral point socket. The neutral point socket constitutes an inner cone, which is delimited by a socket wall which is formed of a non-conductive material. At the closed end of the inner cone, the neutral point contact is retained in an insulated arrangement. The neutral point contact, which shows good electrical conductivity, is thus connected to the winding end of the winding of the respective single-phase transformer such that, in service, it assumes a high-voltage potential. The cable termination or, in other words, the cable connector, constitutes an outer cone, at the free end of which an electrically conductive lead-in contact is provided which, in the plugged-in position, engages with the neutral point contact of the neutral point socket. The lead-in contact is further connected to the inner conductor of a neutral point cable.

According to a further configuration of the invention, the neutral point conductor is arranged, in a contact-safe manner, under a shielding which is fastened to the transformer tank. The shielding is thus arranged above the neutral point conductor, and engages over said neutral point conductor such that the latter is protected against climatic influences, contamination or similar. It is further ensured that the neutral point conductor cannot be inadvertently touched by operating personnel. Unwanted accidents during the operation of the assembly are prevented accordingly. The shielding is electrically connected to the transformer tank, but not to the neutral point conductor.

Appropriately, each transformer tank comprises two neutral point sockets, the neutral point contacts of which are connected to the same end of the respective winding. Both neutral point sockets are thus connected to the neutral point conductor by means of one cable respectively. According to this advantageous further development, the respective winding end is connected to the neutral point conductor by means of two neutral point cables. To this end, two neutral point sockets are configured on each transformer tank, such that both neutral point cables can be rapidly and simply connected to the winding end of the respective winding. In other respects, the above descriptions apply correspondingly. The dual connection firstly permits the conduction of higher compensating currents, and moreover ensures that the neutral point connection, in the event of the failure of one neutral point cable, is maintained by the remaining neutral point cable.

According to a further advantageous configuration of the invention, the neutral point conductor is connected to ground potential by means of a grounding cable, wherein the grounding cable is equipped with a current sensor. According to this further development, zero phase-sequence currents, which flow via the grounding cable which extends between the ground potential connection and the neutral point conductor, are detected by the current sensor. On the output side, the current sensor delivers measured values which correspond to the zero phase-sequence current. The current sensor is appropriately connected by means of a signal line to a protection and/or control unit, which employs the resulting measurement signals for zero phase-sequence currents in the respective protection concept. The signal line can be configured as a wired or a wireless connection.

Further appropriate configurations and advantages of the invention are the subject matter of the following description of exemplary embodiments of the invention, with reference to the drawing in the figures, wherein the same reference numbers identify identically functioning components, and wherein:

BRIEF DESCRIPTION OF THE SEVERAL VIEWS OF THE DRAWING

FIG. 3 illustrates the neutral point conductor according to FIG. 2, with a protective cover.

DETAILED DESCRIPTION OF THE INVENTION

Figure 1:
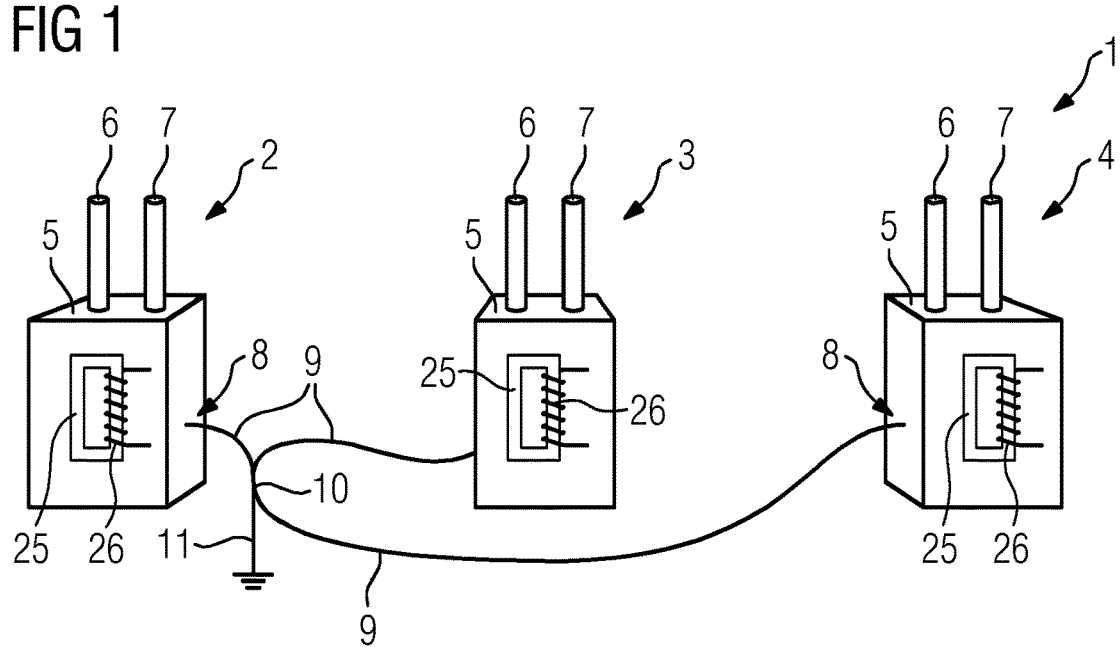
FIG. 1 shows an exemplary embodiment of the assembly according to the invention, in a schematic representation.

FIG. 1 shows a schematic representation of an exemplary embodiment of the assembly 1 according to the invention, which comprises three single-phase transformers 2, 3 and 4. Each single-phase transformer 2, 3 and 4 is represented in a schematic manner only by the respective transformer tank 5 and two high-voltage bushings 6 and 7. A neutral point socket 8 is further illustrated, which is provided in the sidewall of the transformer tank 5 of each single-phase transformer 2, 3 and 4. The neutral point socket 8 comprises a flange connection, by means of which the neutral point socket 8 is connected to the sidewall of the respective transformer tank 5 in a fluid-tight manner. By means of a sidewall which is formed of an electrically non-conductive material, and which delimits an inner cone, the neutral point socket extends into the fluid space of the transformer tank 5, where it constitutes a closed end. At the closed end, an electrically conductive neutral point contact is provided, which projects through the electrically non-conductive sidewall. The neutral point contact, in turn, is connected to one end of a winding which is arranged within the transformer tank, which is described hereinafter as the neutral point winding end.

The neutral point socket 8 is configured with a matching shape to a cable termination which is not represented in the figure, and which constitutes an outer cone, at the free end of which an electrically conductive cable contact is configured which, when the cable termination is inserted in the neutral point socket, engages in contact with the neutral point contact of the neutral point socket 8. The plug-in contact is connected to the inner conductor of a neutral point cable 9. On the side thereof which is averted from the cable termination, each neutral point cable 9 forms a cable shoe. The function of the cable shoe is the fitting of the neutral point cable 9 to the neutral point conductor 10. In this manner, the windings of the single-phase transformers 3 and 4 are connected to the neutral point conductor 10. The neutral point conductor 10 is connected to ground potential by means of a grounding cable 11.

Figure 2:
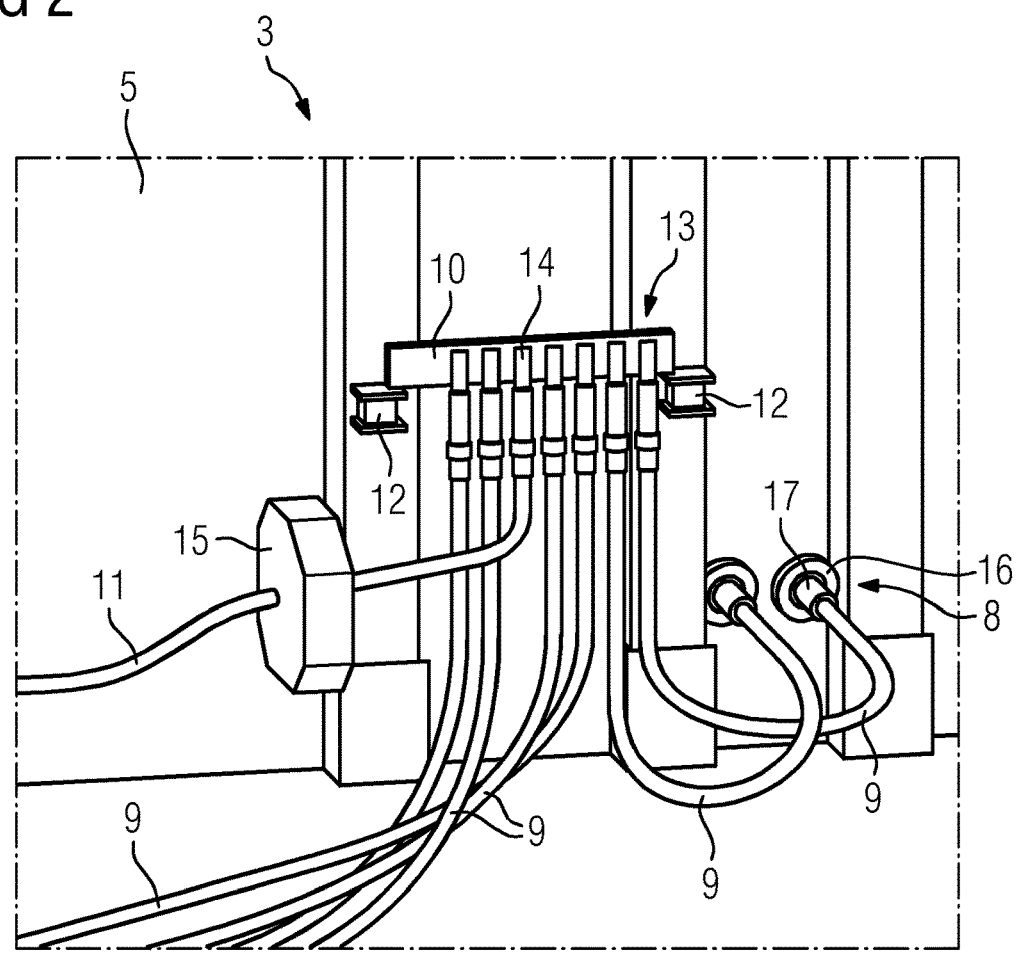
FIG. 2 shows a transformer tank with a neutral point busbar and neutral point cables.

FIG. 2 shows an exemplary embodiment of a neutral point conductor 10, which is fastened to a transformer tank 5 of the single-phase transformer 3 by means of insulators 12. The insulators 12 are comprised of an electrically non-conductive material, for example an elastomer, and are responsible for the insulated retention of the neutral point conductor 10 on the transformer tank 5. Six neutral point cables 9 are fastened to the neutral point conductor 10. To this end, each neutral point cable 9 is provided with a cable shoe 13, which is securely screwed to the neutral point conductor 10 by means of a screw connection 14. The grounding cable 11 can moreover be seen, which extends between the neutral point conductor 10 and a grounding terminal, which is not represented here. The grounding cable 11 is routed through a current sensor 15, which is designed for the detection of zero phase-sequence currents flowing through said grounding cable 11.

Moreover, in FIG. 2, the neutral point socket 8 with its flange section 16 can be seen, into which the cable termination 17 of the respective neutral point cable 9 is inserted. It can be seen that the transformer tank 5 of the single-phase transformer 3 comprises two neutral point sockets 8, wherein each neutral point socket 8 is connected to the neutral point rail 10 by means of a neutral point cable 9. Corresponding arrangements apply to the single-phase transformers 2 and 4, such that the neutral point rail 10 is connected to the cable shoe 13 by six neutral point cables 9. The neutral point winding end of each winding is thus connected to the neutral point conductor 10 by means of two neutral point cables 9. In the exemplary embodiment represented, the neutral point conductor 10 is configured as a rigid copper busbar.

FIG. 3 shows the exemplary embodiment according to FIG. 3 wherein, however, the neutral point rail is covered by a shielding 18, which is disposed over the neutral point rail 10 and is intended to prevent any contact of personnel with said neutral point rail 10. The shielding 18 also provides protection against weather-related contamination. The shielding 18 is connected to the transformer tank 5 in an electrically conductive manner, and engages over the neutral point rail, such that any electrical contact between the shielding 18 and the neutral point rail 10 is prevented.

The invention claimed is:

1. An assembly for connecting to a high-voltage grid, the assembly comprising:
   a plurality of single-phase transformers each including a respective fluid-filled transformer tank and a respective core having at least one respective winding disposed in said respective transformer tank;
   neutral point conductors each being retained on and insulated from a respective one of said transformer tanks, said neutral point conductors interconnecting said windings of said single-phase transformers to form a neutral point; and
   said neutral point being formed on one of said neutral point conductors by connecting said at least one respective winding of all of said plurality of single phase transformers to said one of said neutral point conductors and the remaining neutral point conductor(s) being unused.

2. The assembly according to claim 1, wherein said neutral point conductors are busbars, and insulators fasten said busbars to said transformer tanks.

3. The assembly according to claim 2, wherein each of said transformer tanks is equipped with a respective one of said busbars.

4. The assembly according to claim 1, which further comprises shieldings each being fastened to a respective one of said transformer tanks, said neutral point conductors each being disposed in a contact-safe manner under a respective one of said shieldings.

5. The assembly according to claim 1, which further comprises grounding cables each equipped with a respective current sensor, said neutral point conductors each being connected to ground potential by a respective one of said grounding cables.

6. An assembly for connecting to a high-voltage grid, the assembly comprising:
   a plurality of single-phase transformers each including a respective fluid-filled transformer tank and a respective core having at least one respective winding disposed in said respective transformer tank;
   neutral point conductors each being retained on and insulated from a respective one of said transformer tanks, said neutral point conductors interconnecting said windings of said single-phase transformers to form a neutral point;
   each of said transformer tanks includes a respective neutral point socket having a neutral point contact retained on and insulated from said transformer tank;
   said neutral point contact is connected to at least one of said windings; and
   a neutral point cable connects said neutral point contact to said neutral point conductor.

7. An assembly for connecting to a high-voltage grid, the assembly comprising:
   a plurality of single-phase transformers each including a respective fluid-filled transformer tank and a respective core having at least one respective winding disposed in said respective transformer tank;
   neutral point conductors each being retained on and insulated from a respective one of said transformer tanks, said neutral point conductors interconnecting said windings of said single-phase transformers to form a neutral point;
   each transformer tank including two neutral point sockets having neutral point contacts connected to an identical end of a respective winding; and
   neutral point cables each connecting one of said two neutral point sockets to a respective one of said neutral point conductors.

\* \* \* \* \*